United States Patent [19]
Peterson

[11] Patent Number: 4,577,392
[45] Date of Patent: Mar. 25, 1986

[54] FABRICATION TECHNIQUE FOR INTEGRATED CIRCUITS

[75] Inventor: David R. Peterson, Mountain View, Calif.

[73] Assignee: Advanced Micro Devices, Inc., Sunnyvale, Calif.

[21] Appl. No.: 637,449

[22] Filed: Aug. 3, 1984

[51] Int. Cl.⁴ .................. H01L 21/283; H01L 21/28; H01L 21/56

[52] U.S. Cl. ........................................ 29/571; 29/590; 29/591; 156/643; 156/653; 156/647; 156/659.1; 148/DIG. 19

[58] Field of Search .............................. 29/571, 578; 148/DIG. 141, DIG. 143, DIG. 111, DIG. 106, DIG. 19, DIG. 20; 156/653, 643, 659.1; 357/65, 67, 71

[56] References Cited

U.S. PATENT DOCUMENTS

| 3,523,223 | 8/1970 | Luxem et al. | 317/234 |
|---|---|---|---|
| 4,149,307 | 4/1979 | Henderson | 29/571 |
| 4,259,680 | 3/1981 | Lepselter et al. | 357/35 |
| 4,453,306 | 6/1984 | Lynch et al. | 29/571 |
| 4,466,176 | 8/1984 | Temple | 29/571 |
| 4,477,962 | 10/1984 | Godejahn, Jr. | 29/571 |
| 4,478,679 | 10/1984 | Chang et al. | 156/653 |
| 4,528,066 | 7/1985 | Merkling, Jr. et al. | 156/643 |

OTHER PUBLICATIONS

IBM Technical Disclosure Bulletin, vol. 24, No. 4, Sep. 81, pp. 1970-1973, "Self-Aligned Silicide Conductors in FET IC" Osburn et al.

IEEE IEDM 81-647 "An Optimally Designed Process for Submicron MOSFETS" T. Shibata et al.

IBM Technical Disclosure Bulletin, vol. 27, No. 2, Jul. 1984, pp. 1044-1045 "Salicide with Buried Silicide Layer" Jones et al.

IBM Technical Disclosure Bulletin, vol. 27, No. 3, Aug. 1984, pp. 1801-1802 "New Salicide Spacer Technology" Iyer et al.

Primary Examiner—Brian E. Hearn
Assistant Examiner—Tuan Quach
Attorney, Agent, or Firm—Patrick T. King; Eugene H. Valet; Hubert E. Dubb

[57] ABSTRACT

A method is set forth for forming conductive contacts to first, second and third regions of a substrate. The substrate is covered with an insulating layer having a slot with an island therein. The island is covered with a first sacrificial layer. The substrate is covered with a conformal coating of a dielectric material. The coating is etched off with retention of sacrificial portions of the dielectric material between the island and the insulating layer. The first sacrificial layer is removed from the island while the sacrificial portions remain. A conductive layer is deposited upon the substrate. A second sacrificial layer is laid down upon the conductive layer. The second sacrificial layer is etched away along with the sacrificial portions of the dielectric material while the conductive layer is not significantly removed. Highly conductive contacts are provided with the conductive material self-aligned on the source, drain and gate.

7 Claims, 10 Drawing Figures

FABRICATION TECHNIQUE FOR INTEGRATED CIRCUITS

BACKGROUND OF THE INVENTION

1. Field of the Invention

This invention relates generally to a method for forming conductive contacts to different regions of a semiconductor substrate and to the resulting semiconductor device. More particularly, the invention relates to a method of forming contacts with active regions in an MOS transistor or the like, which regions comprise the source region and the drain region, while maintaining electrical isolation between the regions and the gate. The resulting device permits positive self-aligned contact to be made to the source region, drain region and gate of an MOS transistor.

2. Discussion of Background and Prior Art

Metal oxide semiconductor (MOS) devices are well known. Field effect transistors (FET) MOS devices are also well known and are generally referred to as MOSFETs. For example, a p-channel MOSFET consists of a lightly doped n-type substrate into which two highly doped p+regions are diffused. One of the p+regions is connected to a conductor and is referred to as a source. The other of the p+regions is connected to another conductor and is referred to as a drain. Between the source and the drain another conductor is positioned which is known as the gate. The source and the drain are diffused into the silicon and the gate sits atop an insulating layer, generally a silicon dioxide layer. In essence, the gate is charged so as to induce a p-channel between the two separated p+regions of the MOSFET. This will produce an enhancement type MOS. N-channel MOSFETs can similarly be constructed.

One problem with the prior art MOSFET devices has been that the diffused doped regions have generally had a relatively high resistance. Another problem with the prior art MOSFETs has been the tight alignment tolerance to the source, gate and drain contacts. Still another problem has been that there has been relatively high overlap capacitance and resulting punch through via the induced channel. Furthermore, polysilicon has often been used as the gate material and this has a relatively high resistance.

Shibata, et al, in an article entitled "An Optimally Designed Process for Submicron MOSFETS" describe a process wherein a platinum silicide layer is plated to the surfaces of the source, drain and gate polysilicon in a self-aligning way to reduce the source or drain resistance and the resistance of the polysilicon interconnect. A CVD $SiO_2$ layer is deposited after delineation of the gate polysilicon and reactive ion etching of the $SiO_2$ layer. This results in prism-shaped oxide coverings on the side walls of the polysilicon gates. Platinum silicide layers are formed selectively on the exposed silicon surfaces. The platinum-silicide layer is made by depositing the platinum upon the silicon, heating, and thereby forming the silicide in situ. Thus, this process is limited to silicides which may be formed by rapidly diffusing metals such as platinum and to areas of exposed silicon. These silicides tend to have a relatively higher resistivity than do silicides of refractory metals.

DISCLOSURE OF THE INVENTION

The present invention is directed to overcoming one or more of the problems as set forth above.

In accordance with an embodiment of the present invention a method is set forth for forming conductive contacts to first and second regions and to form a gate above a third region of a respective one of an n-type and a p-type substrate having a portion of a surface thereof covered to a first thickness with an insulating layer and having a slot therethrough which extends substantially to the surface, the surface in the slot being covered with an isolation layer, the slot having a sidewall structure having first and second edges. A conductive island is located within the slot and covers the surface to substantially the first thickness. The conductive island has a bank having first and second areas which face, respectively, the first and second edges of the sidewall structure. The first region and the second region are non-contiguous with one another and are located, respectively, between the first area of the bank and the first edge of the sidewall structure and between the second area of the bank and the second edge of the sidewall structure. The first and second regions are non-contiguous with the bank. The third region is generally beneath the island. The first and second regions are generally a respective other of n-type and p-type than is the substrate. In accordance with the present invention the substrate is provided with the island covered with a first sacrificial layer which extends beyond the first thickness. The insulating layer, the conductive island, and the isolation layer are covered with a generally conformal coating of a dielectric material. The coating of the dielectric material is anisotropically orthogonally etched off of the insulating layer, the isolation layer and the first sacrificial layer while retaining sacrificial portions of the dielectric material between the first area of the bank and the first region and between the second area of the bank and the second region. The first sacrificial layer is removed from the island and the isolation layer from the first region and the second region without significantly removing the sacrificial portions of the dielectric material. A conductive layer is deposited in covering relation upon the insulating layer, the island, the first region and the second region. A second sacrificial layer is laid down upon the conductive layer and then etched away along with the sacrificial portions of the dielectric material, all without significantly removing the conductive layer.

In accordance with another embodiment of the present invention a semiconductor device is set forth which comprises a respective one of a n-type and a p-type substrate having a portion of a surface covered to a first thickness with an insulating layer having a slot therethrough which extends substantially to the surface, the slot having a sidewall structure having first and second edges. A conductive island covers the surface within the slot to substantially the first thickness and has a bank having first and second areas facing, respectively, the first and second edges of the sidewall structure. The first edge and first area have a first region of the substrate located between them and spaced from the first bank. The second edge and the second area have a second region of the substrate located between them and spaced from the second bank. The first and second regions are a respective other of n-type and p-type then is the substrate. The first and second regions are non-contiguous with one another. A third region of the substrate lies generally beneath the island. A first refractory metal containing conductor is upon and in conducting relation to the first region and extends atop the insulating layer adjacent the first edge and is spaced apart from the first area to define a first gap therebetween. A second refractory metal conductor is upon and in conducting relation to the second region and extends atop the insulating layer adjacent the second edge and is spaced apart from the second area to define a second gap therebetween. A third refractory metal containing conductor is upon the island.

The various embodiments of the present invention provide significant advantages over the prior art. In particular, all diffused beds are covered with and in conductive relation with a material of high conductance. Second, all contacts are self-aligned relative to the gate. Third, the conductive material on the gate is self-aligned for low resistance. Fourth, the diffused contacts are self-aligned which provides improved device performance. Fifth, the conductors extend upon the insulating layer making connection to adjacent devices, e.g., MOSFETs, convenient. By the use of an edge structure generated by an anisotropic etch in accordance with the method of the present invention, a sharp separation of the gate and the contact area is achieved. The contact material is deposited and delineated at field edge by the sacrificial layer, generally a photoresist layer, and at the gate edge or bank by the generated edge defined feature.

BRIEF DESCRIPTION OF DRAWINGS

The invention will be better understood by reference to the figures of the drawings wherein like numbers denote like parts throughout and wherein.

BEST MODE FOR CARRYING OUT INVENTION

Figure 1:
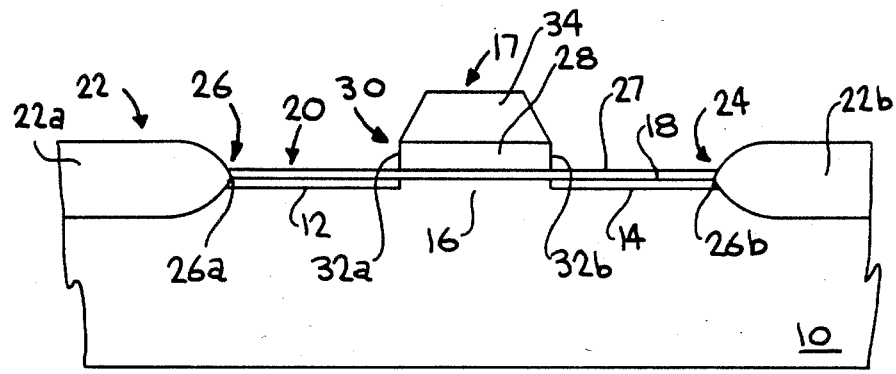
FIGS. 1–8 illustrate, sequentially, steps in an embodiment of the method of the present invention with FIG. 8 showing a device in accordance with the embodiment of the present invention.
Figure 2:
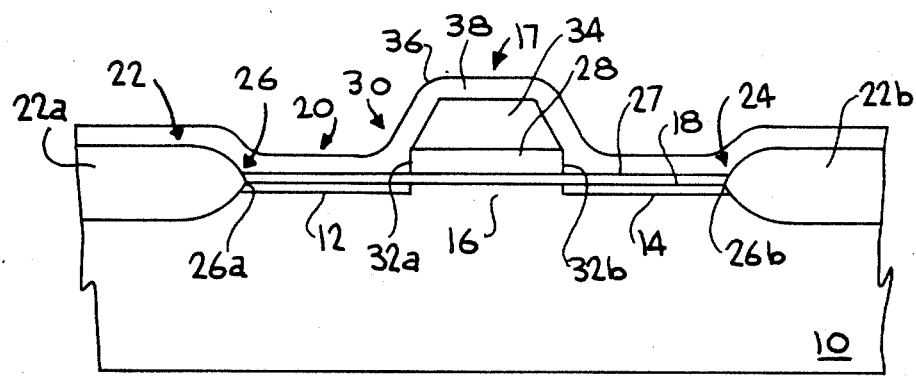

FIGS. 1–8 illustrate, sequentially, a method in accordance with the present invention for forming conductive contacts to a respective one of an n-type and a p-type substrate 10. The contacts are to be formed to a first region 12 and a second region 14 and of the substrate 10. The first region 12 may be a doped source region, the second region 14 may be a doped drain region. A third region 16 of the substrate, located between the first region 12 and the second region 14, may be a channel region. The third region 16, in such an instance, will be covered with a gate 17.

The substrate 10 has a portion 18 of a surface 20 thereof covered to a first thickness with an insulating layer 22 having a slot 24 therethrough which extends substantially to the surface 20. The slot 24 has a sidewall structure 26 having first 26a and second 26b edges 26a,26b. An insulating isolation layer 27, e.g., silicon nitride or silicon dioxide, covers the surface of the slot 24.

A conductive island 28 covers the surface portion 18 within the slot 24 (above the isolation layer 27) to substantially the first thickness and has a bank 30 having first 32a and second 32b areas 32a,32b facing, respectively the first edge 26a and the second edge 26b of the sidewall structure 26.

The first region 12 and the second region 14 are non-contiguous with one another and are located, respectively, between the first area 32a of the bank 30 and the first edge 26a of the sidewall structure and the second area 32b of the bank 30 and the second edge 26b of the sidewall structure 26. The first region 12 and the second region 14 are non-contiguous with the bank 30 thereby preventing conduction therebetween. The third (channel) region 16 is generally beneath the island 28. The first region 12 and the second region 14 are respective other of n-type and p-type than is the substrate 10.

In accordance with the present invention the substrate 10 is provided with the island 28 covered with a first sacrificial layer 34 which extends beyond the first thickness. The first sacrificial layer 34 can be, for example, the photoresist which was used to delineate region 28.

The insulating layer 22, the conductive island 34, and the isolation layer 27 are covered with a generally conformal coating 36 of a dielectric material 38. This is seen most clearly in FIG. 2. This can be accomplished, for example, by the plasma enhanced deposition of, for example, $Si_3N_4$ or $SiO_2$, or by other deposition methods which may be performed under low temperature conditions including chemical vapor desposition, sputtering and vacuum deposition.

The first sacrificial layer 34 remains in place between the conductive island 28 and the conformal coating 36 of the dielectric material 38. This is important, as will later be apparent, in order to obtain sharp delineation of the bank 30 from the first region 12 and from the second region 14.

Figure 3:
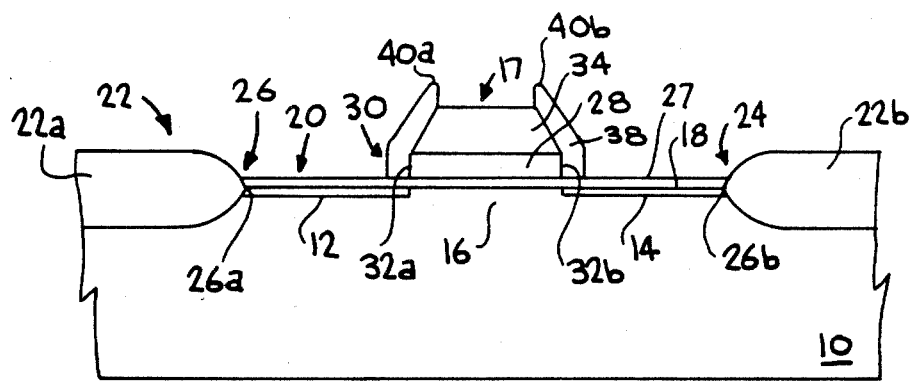

The conformal coating 36 of the dielectric material 38 is next anisotropically orthogonally etched off of the insulating layer 22, isolation layer 27 and the first sacrificial layer 34 in such a manner that sacrificial portions 40a,40b of the dielectric material 38 are retained between the first area 32a of the bank 30 and the first region 12 and also between the second area 32b of the bank 30 and the second region 14. This can be accomplished by, for example, reactive ion etching or plasma etching carried out conventionally in a manner so as to achieve an anisotropic etch. At the end of this step the structure is generally that as shown in FIG. 3. It should be noted that the sacrificial portions 40a,40b of dielectric material 38 are particularly highly raised from the surface 20 of the substrate 10 because of the presence of the first sacrificial layer 34.

Figure 4:
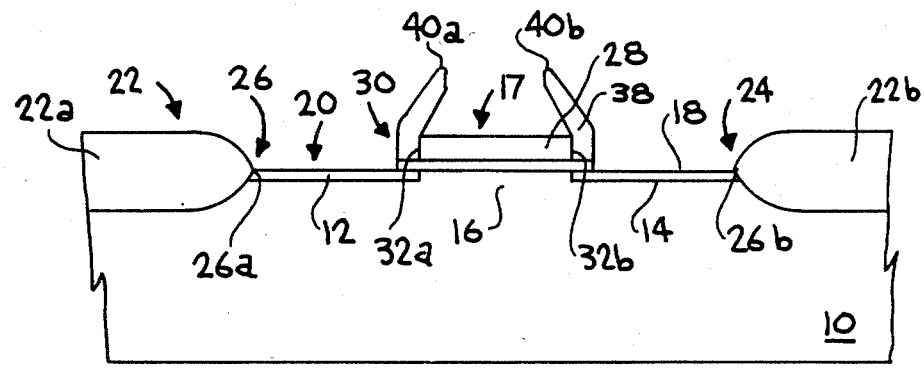
Figure 5:
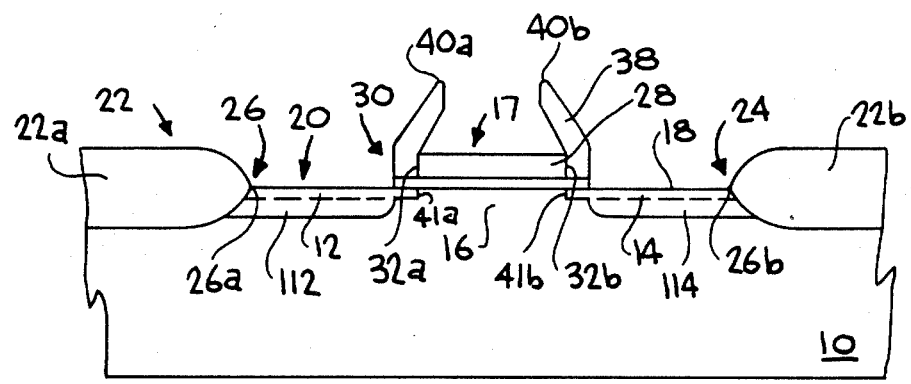

The first sacrificial layer 34 is next removed from the island 28 without significantly removing the sacrificial portions 40a,40b of the dielectric material 38. The first sacrificial layer, which may be, for exemple, photoresist or some other organic material, can be removed, for example, by using an oxygen plasma or by a chemical wash treatment utilizing a chemical, e.g., $H_2SO_4$; $H_2O_2$ or another suitable stripper. The isolation layer 27 is removed by the same step or is at least removed sufficiently so as to expose the first region 12 and the second region 14 so that good contact can be attained. FIG. 4 shows the substrate 10 following this step.

In accordance with a preferred embodiment of the invention, the first region 12 and the second region 14 are next conventionally doped to a further depth to include the extended first region 112 and the extended second region 114. Because of the presence of the sacrificial portions 40a, 40b, the extended regions 112, 114 do not extend to the bank 30. Portions 41a, 41b of the regions 12, 14 do extend to the bank 30 as well as being contiguous with the extended regions 112, 114. In FIGS. 5–8 and 10 a dashed line is included to show the extension of the regions 12, 14 even though such are no longer distinct regions following the added doping of the regions 112, 114.

Next, a conductive layer 42 is deposited in covering relation upon the insulating layer 22, the island 28, the first region 12 and the second region 14. The depositing of the conductive layer 42 may be by vapor phase deposition, for example by deposition of a metal silicide, preferably a refractory metal silicide such as tantalum silicide (TaSi$_2$) or titanium silicide (TiSi$_2$). The term refractory metal silicide as used herein includes the silicides of W, Mo, Ta, Ti, Ci, Ni, Co, and Hf. Alternatively, the conductive layer 42 can be deposited by a sputtering process or evaporation.

Figure 6:
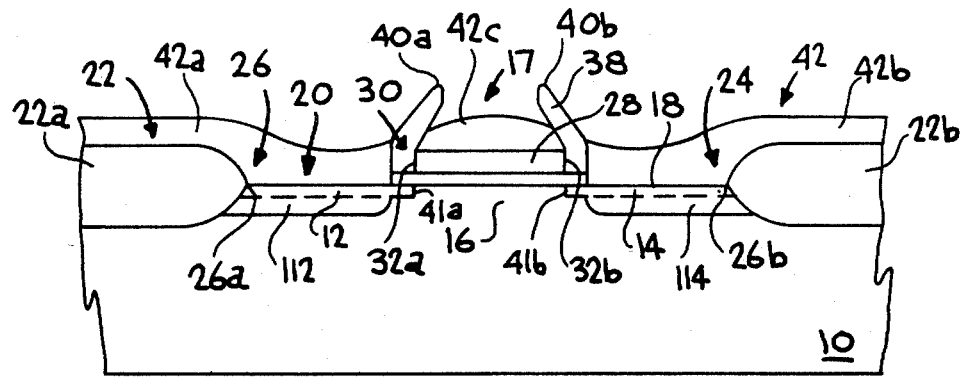
Figure 7:
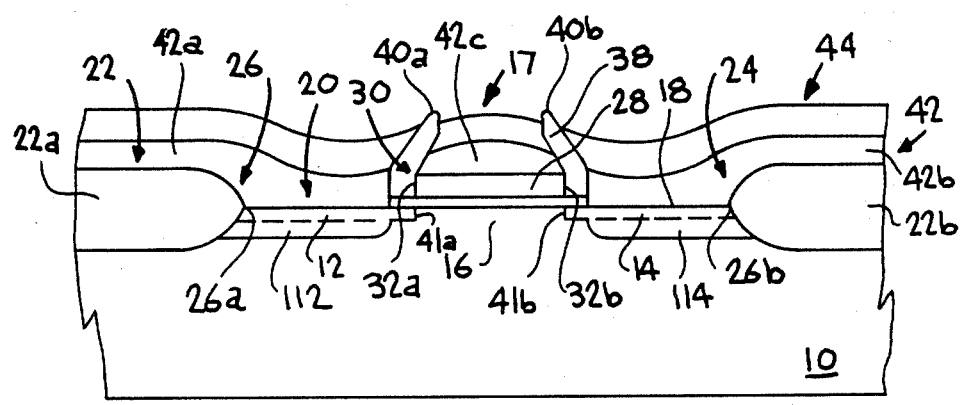

FIG. 6 shows the substrate 10 as layered following deposition of the conductive layer 42. It should be noted that the conductive layer 42 later forms the conducting materials which communicate conductively with each of the first region 12, and the second region 14 and which forms the gate 17 atop the third region 16. That portion of the conductive layer 42 which is in covering relationship upon the first region 12 is designated 42a that portion of the conductive layer 42 which is upon the second region 14 is designated 42b and that region of the conductive layer 42 which is upon the island 28, atop the third region 16, is designated 42c.

A second sacrificial layer 44 is laid down upon the conductive layer 42. The second sacrificial layer 44 would generally be an organic coating, more generally conventional photoresist material laid down in a conventional manner. Basically, the photoresist material which serves as the second sacrificial layer 44 provides a masking function to prevent significant erosion of the conductive layer 42 in those areas in which it is required to retain the conductive layer during the next step of the process.

Finally, the second sacrificial layer 44 and the sacrificial portions 40a, 40b of the dielectric material 38 are etched away while not significantly removing the conductive layer 42. The etching procedure can consist of a plasma or reactive ion etch of a type which will react with said layer. Chemicals of the Freon type as well as the other halogen compounds are suitable for this purpose.

Figure 8:
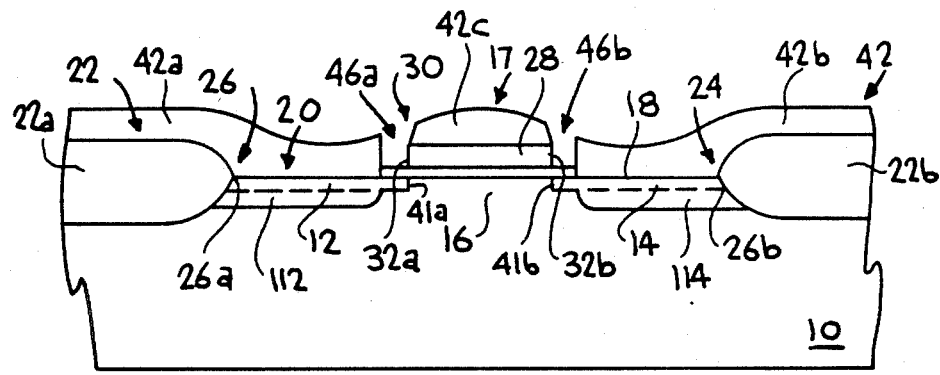
Figure 9:
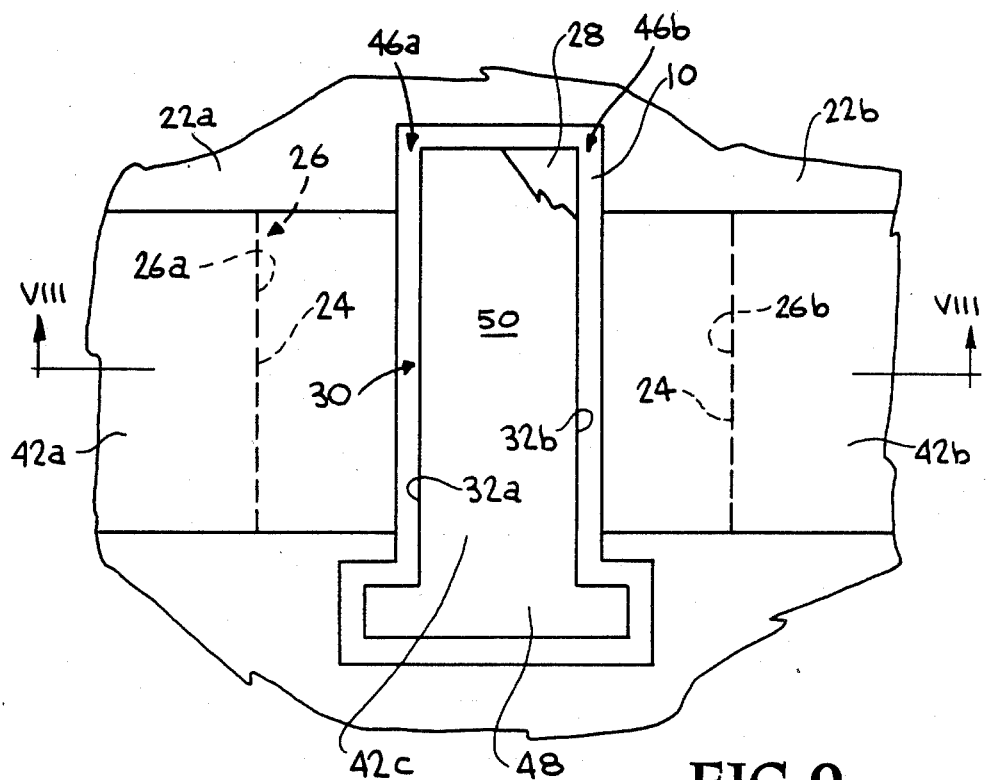
FIG. 9 illustrates a top view of the device illustrated in FIG. 8.

Adverting to FIGS. 8 and 9 it will be noticed that a pair of gaps 46a, 46b are provided which are particularly well defined because of the significant height extension of the sacrificial portions 40a, 40b of the dielectric material 38 seen in FIG. 4. And, this relatively great height for the sacrificial portions 40a, 40b results because of the retention of the first sacrificial layer 34 upon the island 28 during the deposition of the conformal coating 36.

From FIG. 9 it will be apparent that the island 28 is generally T-shaped and includes a crossbar 48 and a longitudinal generally rectangular bar 50. The gaps 46a, 46b are then defined between the T-shaped slot 24 and a similar T-shape defined by the conductive layer 42a, 42b and by the substrate 10.

ALTERNATE EMBODIMENT

Figure 10:
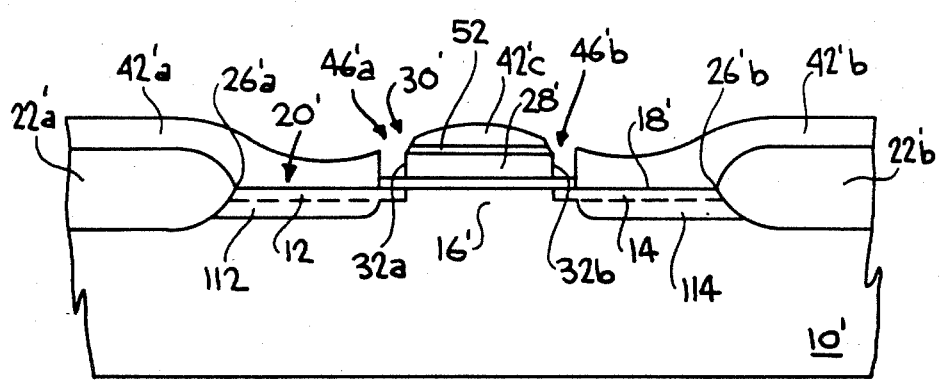
FIG. 10 illustrates an alternate embodiment of the present invention in a view similar to that of FIG. 8.

FIG. 10 illustrates an alternate embodiment to that of FIGS. 1-9 which varies from the embodiment of the FIGS. 1-9 only in including a refractory metal or metal silicide layer 52 between the conductive layer portion 42c and the conductive island 28.

In accordance with the present invention not only is a novel method set forth for forming semiconductor devices such as MOSFETs but also a novel semiconductor device is set forth. The device comprises a respective one of an n-type and a p-type substrate 10 having a portion 18 of a surface 20 covered to a first thickness with an insulating layer 22 having a slot 24 therethrough which extends substantially to the surface 20, the slot having a sidewall structure 26 having first 26a and second 26b edges 26a, 26b.

A conductive island 28 covers the surface 20 within the slot 24 to substantially the first thickness and has a bank 30 having first 32a and second 32b areas 32a, 32b facing, respectively, first 26a and second 26b edges of the sidewall structure 26. The first edge 26a and the first area 32a have located between them and insulated from the first area 32a, a first region 12 of the substrate 10. The second edge 26b and the second area 32b have located between them and spaced from the second area 32b the second region 14 of the substrate 10. The first 12 and second 14 regions are a respective other of n-type and p-type than is the substrate 10. The first 12 and second 14 regions are non-contiguous with one another. A third region 16 of the substrate 10 is generally beneath the island 28.

A first refractory metal containing conductor 42a is upon and in conducting relation to the first region 12 and extends atop the insulating layer 22 adjacent the first edge 26a and spaced apart from the first area 32a to define a first gap 46a. A second refractory metal containing conductor 42b is upon and in conducting relation to the second region 14 and extends atop the insulating layer 22 adjacent the second edge 26b and spaced apart from the second area 32b to define a second gap 46b therebetween. A third refractory metal containing conductor is upon and in conducting relation to the island 28. Generally, the first conductor 42a, the second conductor 42b and the third conductor 42c are of substantially the same material and are laid down as set forth in the method above.

Through use of a doping step to obtain the extended regions 112, 114, the regions 12, 14, are shaped so as to be highly doped yet, since their thickness near the bank 30 is only that of the original regions 12, 14, to have very low capacitive coupling to the gate 17.

INDUSTRIAL APPLICABILITY

Operation in accordance with the present invention allows the preparation of MOSFET and other devices. Devices made in accordance with the present invention have the advantage that all diffused beds are layered over with a highly conductive material, all contacts are self-aligned relative to the gate, there is self-aligned conductive material on the gate for low resistance, self-alignment is provided at diffused contacts for improved device performance, and the conductive layer may be extended over oxide areas as can not be done with prior art reactive silicide processes.

The foregoing description of the invention has been presented for purposes of illustration and description. It is not intended to be exhaustive or to limit the invention to the precise form disclosed, and obviously many modifications and variations are possible in light of the above teaching. The embodiment was chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended thereto.

I claim:

1. A method for forming conductive contacts to first and second regions separated by a third region of a respective one of an n-type and a p-type substrate having a portion of a surface thereof covered to a first thickness with an insulating layer having a slot therethrough which extends substantially to said surface, said surface in said slot being covered with an isolation layer, said slot having a sidewall structure having first and second edges, a conductive island covering said surface portion within said slot to substantially said first thickness and having a bank having first and second areas facing, respectively, said first and second edges of said sidewall structure, said first region and said second region being non-contiguous with one another, being located, respectively, between said first area of said bank and said first edge of said sidewall structure and said second area of said bank and said second edge of said sidewall structure, and being non-contiguous with said bank, said third region being generally beneath said island, said first and second regions being a respective other of n-type and p-type than is said substrate, comprising:

providing said substrate with said island covered with a first sacrificial layer which extends beyond said first thickness;

covering said insulating layer, said conductive island, and said isolation layer with a generallly conformal coating of a dielectric material;

anisotropically orthogonally etching said coating of said dielectric material off of said insulating layer, said isolation layer and said first sacrificial layer while retaining sacrificial portions of said dielectric material between said first area of said bank and said first region and between said second area of said bank and said second region;

removing said first sacrificial layer from said island and said isolation layer from said first region and said second region without significantly removing said sacrificial portions of said dielectric material;

depositing a conductive layer in covering relation upon said insulating layer, said island, said first region and said second region;

laying down a second sacrificial layer upon said conductive layer; and etching away said second sacrificial layer and said sacrificial portions of said dielectric material while not significantly removing said conductive layer.

2. A method as set forth in claim 1, wherein said conductive layer comprises a metal silicide.

3. A method as set forth in claim 2, wherein said first sacrificial layer comprises a photoresist material.

4. A method as set forth in claim 1, including as an added step following said removing step and preceding said depositing step:

further doping said first region and said second region, substantially excluding an area thereof beneath said sacrificial portions, to extend to an added depth into said substrate.

5. A method as set forth in claim 1, wherein said substrate further includes an additional conductive layer between said island and said first sacrificial layer.

6. A method as set forth in claim 5, wherein said additional conductive layer comprises a metal or a metal silicide.

7. A method as set forth in claim 2, wherein said slot and said island are substantially T-shaped and include respective longitudinal rectangular bars and crossbars which define gaps between said first and second areas and said longitudinal bar.

* * * * *